(12) United States Patent
Park et al.

(10) Patent No.: US 11,575,845 B2
(45) Date of Patent: Feb. 7, 2023

(54) INFRARED IMAGE SENSOR AND INFRARED CAMERA MODULE

(71) Applicant: SAMSUNG ELECTRO-MECHANICS CO., LTD., Suwon-si (KR)

(72) Inventors: Jung Eui Park, Suwon-si (KR); Do Hwan Kim, Suwon-si (KR); Seo Hyung Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 58 days.

(21) Appl. No.: 17/341,889

(22) Filed: Jun. 8, 2021

(65) Prior Publication Data

US 2022/0132051 A1    Apr. 28, 2022

(30) Foreign Application Priority Data

Oct. 26, 2020  (KR) .......................... 10-2020-0139603

(51) Int. Cl.
*H04N 5/33*    (2006.01)
*G01J 5/0806*    (2022.01)
(Continued)

(52) U.S. Cl.
CPC .............. *H04N 5/33* (2013.01); *G01J 5/0806* (2013.01); *G01J 5/0853* (2013.01); *G01J 5/20* (2013.01);
(Continued)

(58) Field of Classification Search
CPC .... H04N 5/33; H04N 5/2253; H04N 5/36961; G01J 5/0806; G01J 5/0853; G01J 5/20;
(Continued)

(56) References Cited

U.S. PATENT DOCUMENTS 8,975,583 B2    3/2015  Tinkler et al.
10,110,833 B2   10/2018  Teich et al.
(Continued)

FOREIGN PATENT DOCUMENTS

JP    2001-194579 A    7/2001
KR    10-0876459 B1    12/2008
(Continued)

OTHER PUBLICATIONS

Korean Office Action dated Oct. 11, 2021, in counterpart Korean Patent Application No. 10-2020-0139603 (7 pages in English and 5 pages in Korean).

*Primary Examiner* — David P Porta
*Assistant Examiner* — Meenakshi S Sahu
(74) *Attorney, Agent, or Firm* — NSIP Law

(57) ABSTRACT

An infrared image sensor includes a first integrate circuit (IC), a bolometer disposed on or above one surface of the first IC configured to detect infrared rays passing through a lens module, a via electrically connecting the first IC and the bolometer, and a reflective layer disposed between the first IC and the bolometer, wherein the first IC includes at least one of a read-out (RO) element configured to perform analog processing for the bolometer to generate infrared sensing information and an image signal process (ISP) element configured to perform digital processing based on the bolometer to generate infrared image information, and at least one of an autofocusing (AF) control element and an optical image stabilization (OIS) control element configured to adjust a positional relationship between the lens module and the bolometer.

17 Claims, 12 Drawing Sheets

(51) Int. Cl.
  *G01J 5/08*   (2022.01)
  *G01J 5/20*   (2006.01)
  *G01J 5/00*   (2022.01)
  *H01L 31/09*  (2006.01)

(52) U.S. Cl.
  CPC ....... *G01J 2005/0077* (2013.01); *H01L 31/09* (2013.01)

(58) Field of Classification Search
  CPC ...... G01J 5/04; G01J 5/084; G01J 5/22; G01J 5/0215; H01L 31/09; H01L 27/14636; H01L 27/14605; H01L 27/14634
  See application file for complete search history.

(56)　　　　References Cited

U.S. PATENT DOCUMENTS

| | | |
|---|---|---|
| 2014/0184807 A1 | 7/2014 | Simolon et al. |
| 2016/0097681 A1* | 4/2016 | Buchan .................. G01J 5/045 250/338.4 |
| 2019/0313007 A1 | 10/2019 | Kim |

FOREIGN PATENT DOCUMENTS

| | | |
|---|---|---|
| KR | 10-0924179 B1 | 10/2009 |
| KR | 10-2015-0019854 A | 2/2015 |
| KR | 10-2019-0117176 A | 10/2019 |
| KR | 10-2054175 B1 | 12/2019 |
| WO | WO 2002/052233 A2 | 7/2002 |
| WO | WO 2006/026317 A2 | 3/2006 |

* cited by examiner

INFRARED IMAGE SENSOR AND INFRARED CAMERA MODULE

CROSS-REFERENCE TO RELATED APPLICATIONS

This application claims the benefit under 35 USC 119(a) of Korean Patent Application No. 10-2020-0139603 filed on Oct. 26, 2020, in the Korean Intellectual Property Office, the entire disclosure of which is incorporated herein by reference for all purposes.

BACKGROUND

1. Field

The present disclosure relates to an infrared image sensor and an infrared camera module.

2. Description of the Background

Infrared imaging devices that enable an object to be seen even in an unlit environment by using infrared rays emitted by the object are currently widely used in the defense, medical, and industrial fields. In the past, infrared imaging systems were mainly developed for use in the defense field. However, in recent years, the market has been rapidly expanding, centering on civilian fields such as vehicle vision assistive devices and security cameras. In recent years, research and development are being conducted for use in mobile devices and wearable devices. Accordingly, a need for a portable infrared camera having a relatively small size and using a relatively low amount of power is increasing.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an infrared image sensor includes a first integrated circuit (IC), a bolometer disposed on or above one surface of the first IC configured to detect infrared rays passing through a lens module, a via electrically connecting the first IC and the bolometer, and a reflective layer disposed between the first IC and the bolometer, wherein the first IC includes at least one of a read-out (RO) element configured to perform analog processing for the bolometer to generate infrared sensing information and an image signal process (ISP) element configured to perform digital processing based on the bolometer to generate infrared image information, and at least one of an autofocusing (AF) control element and an optical image stabilization (OIS) control element configured to adjust a positional relationship between the lens module and the bolometer.

The infrared image sensor may further include a second IC disposed on an other surface of the first IC opposite the one surface of the first IC, wherein the second IC comprises at least a portion of the ISP element, and may be configured to output the infrared image information outside the second IC, and wherein the first IC may be configured to output a value corresponding to a distance by which the lens module is to move, outside the first IC.

The first IC may include the RO element and the ISP element, and the ISP element may be configured to convert and digitally process the infrared sensing information into a digital value.

The first IC may include the ISP element, may be configured to output the infrared image information outside the first IC, and may be configured to output a value corresponding to a distance by which the lens module is to move, outside the first IC.

The ISP element may be configured to extract at least one of position information and acceleration information of the lens module, based on at least one of the infrared sensing information and the infrared image information, and wherein at least one of the AF control element and the OIS control element may be configured to generate a value corresponding to a distance by which the lens module is to move, based on the at least one of the position information and the acceleration information.

At least one of the AF control element and the OIS control element may be configured to receive a detection result from at least one of a position sensor and an acceleration sensor, and output a value corresponding to a distance by which the lens module is to move, based on the detection result from the at least one of the position sensor and the acceleration sensor, outside the first IC.

The first IC may include the AF control element and the OIS control element.

An infrared camera module may include the infrared image sensor, a lens module arranged to transmit infrared rays directed to the infrared image sensor, and a driver configured to drive the lens module to control at least one of the position or acceleration of the lens module, based on a value corresponding to a distance by which the lens module is to move, based on at least one of an autofocusing (AF) control element of the infrared image sensor and an optical image stabilization (OIS) control element of the infrared image sensor.

In another general aspect, an infrared image sensor includes a first integrated circuit (IC) and a second IC, stacked on each other, a bolometer disposed on or above one surface of one of the first and second ICs configured to detect infrared rays passing through a lens module, a via electrically connecting one of the first and second ICs to the bolometer, and a reflective layer disposed between the bolometer and one of the first and second ICs, wherein the first IC includes at least one of a read-out (RO) element configured to perform analog processing for the bolometer to generate infrared sensing information and an image signal process (ISP) element configured to perform digital processing based on the bolometer to generate infrared image information, and wherein the second IC includes at least one of an autofocusing (AF) control element and an optical image stabilization (OIS) control element configured to adjust a positional relationship between the lens module and the bolometer.

The second IC may include at least a portion of the ISP element, the first IC may be configured to transfer a remaining portion of the ISP element or a processing result of the RO element to the second IC, and the second IC may be configured to output the infrared image information outside the second IC, and may be configured to output a value corresponding to a distance by which the lens module is to move, outside the second IC.

The first IC may include the RO element and the ISP element, the ISP element may be configured to convert and digitally process the infrared sensing information into a digital value, the first IC may be configured to output the infrared image information outside the first IC, and the second IC may be configured to output a value corresponding to a distance by which the lens module is to move, outside the second IC.

The infrared image sensor may further include a third IC stacked on one of the first and second ICs or stacked between the first and second ICs, wherein the third IC may include at least a portion of the ISP element, and may be configured to output the infrared image information outside the third IC.

The first IC may include the ISP element, the ISP element may be configured to extract at least one of position information and acceleration information of the lens module, based on at least one of the infrared sensing information and the infrared image information, and at least one of the AF control element and the OIS control element may be configured to output a value corresponding to a distance by which the lens module is to move, based on the at least one of the position information and the acceleration information, outside the second IC.

At least one of the AF control element and the OIS control element may be configured to receive a detection result from at least one of a position sensor and an acceleration sensor, and may be configured to output a value corresponding to a distance by which the lens module is to move, based on the detection result from the at least one of the position sensor and the acceleration sensor, outside the second IC.

The second IC may include the AF control element and the OIS control element.

The first IC and the second IC may be electrically connected to each other through a conductive pad or a through-silicon-via (TSV) disposed therebetween.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
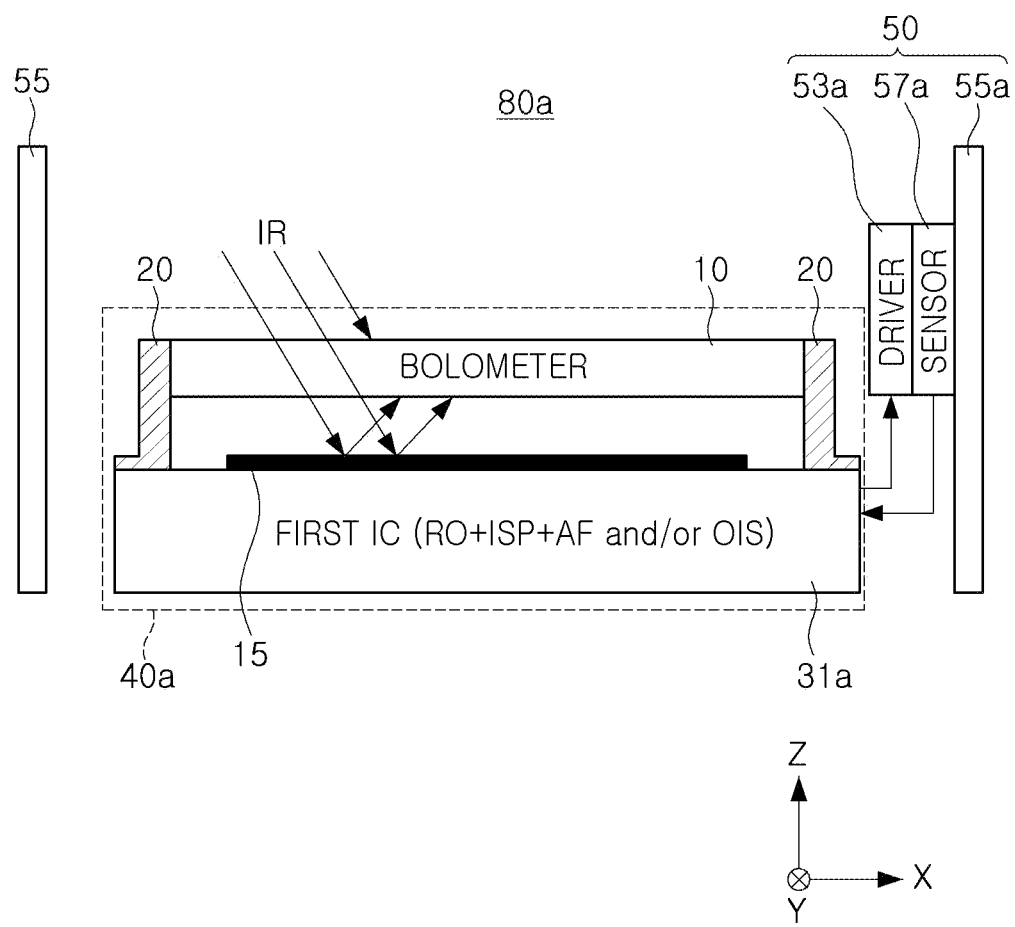
FIG. 1 is a view illustrating a structure in which an integrated circuit (IC) of an infrared image sensor according to an embodiment of the present disclosure is provided in singular.

Hereinafter, while example embodiments of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of functions and constructions that would be well known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Herein, it is noted that use of the term "may" with respect to an example or embodiment, for example, as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or a part of the whole element less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," and the like may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

An aspect of the present disclosure is to provide an infrared image sensor and an infrared camera module.

Figure 3A:
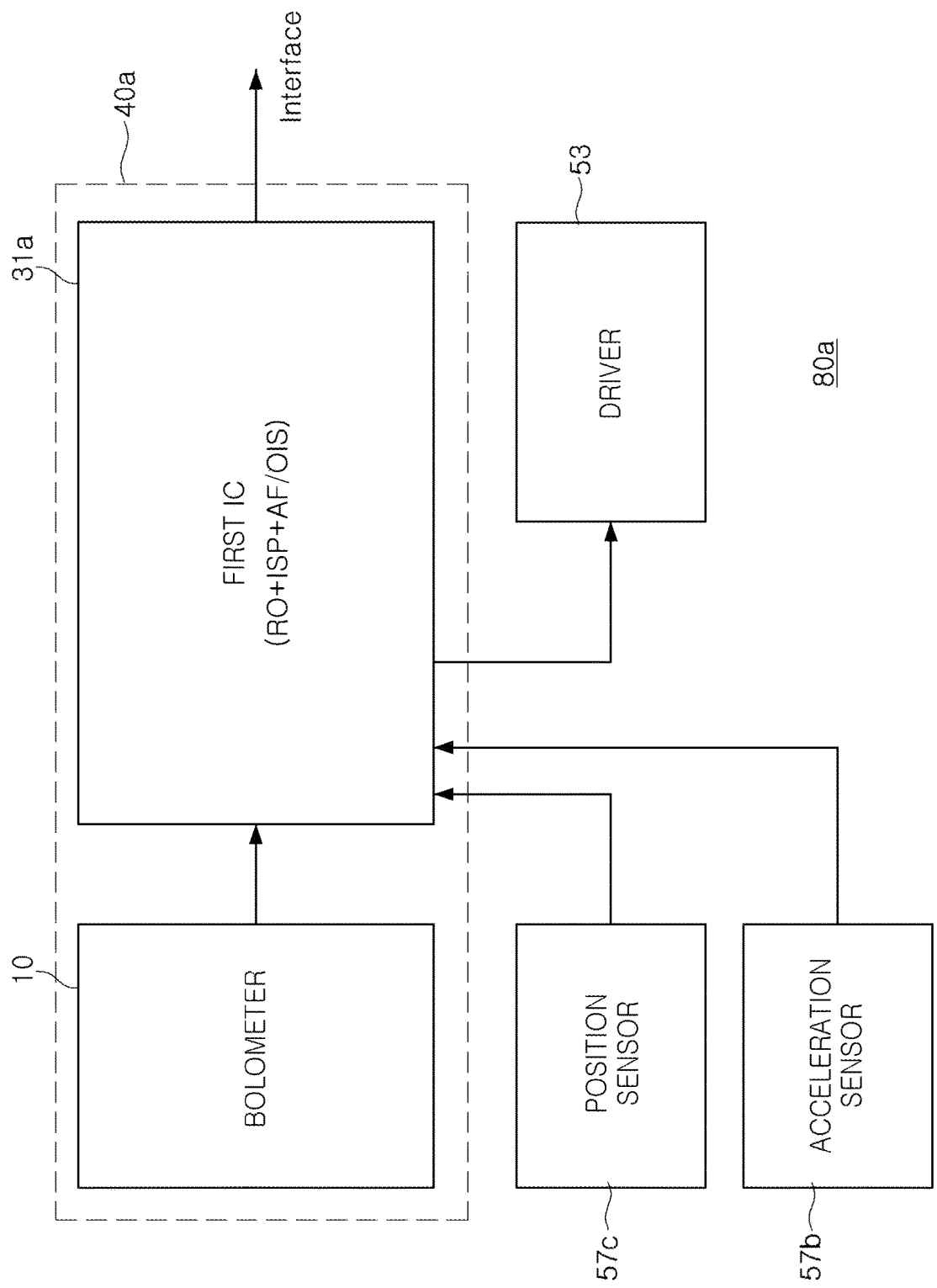
FIG. 3A is a block diagram illustrating the infrared image sensor illustrated in FIG. 1.

FIG. 1 is a view illustrating a structure in which an integrated circuit (IC) of an infrared image sensor according to an embodiment of the present disclosure is provided in singular, and FIG. 3A is a block diagram illustrating the infrared image sensor illustrated in FIG. 1.

Referring to FIG. 1, an infrared camera module 80a according to an embodiment of the present disclosure may include an infrared image sensor 40a according to an embodiment of the present disclosure, and the infrared image sensor 40a may include a bolometer 10, a reflective layer 15, a via 20, and a first IC 31a.

Infrared rays (IR) may be absorbed by the bolometer 10. In this case, electrical parameters (e.g., a resistance value, a current, a voltage, or the like) of the bolometer 10 may vary as infrared ray (IR) is absorbed. Therefore, infrared information for a position in which the bolometer 10 is disposed may be detected by the electrical parameters of the bolometer 10.

For example, the bolometer 10 may have a structure in which a plurality of bolometer cells are two-dimensionally arranged. An infrared image may be generated based on a combination of infrared information for each of the plurality of bolometer cells.

For example, the bolometer 10 may include vanadium oxide (VOx) and/or amorphous silicon, and may be implemented by a silicon wafer process. Therefore, a combined structure of the bolometer 10 and the first IC 31a may be efficiently implemented.

When the first IC 31a is disposed in a path of infrared rays (IR) passing through a lens module, the bolometer 10 may detect the infrared rays (IR).

The reflective layer 15 may be disposed between the first IC 31a and the bolometer 10, and may reflect infrared rays (IR). An upper surface of the first IC 31a may be used as an arrangement space for the reflective layer 15. A separation distance between the reflective layer 15 and the bolometer 10 may correspond to ¼ of a wavelength of infrared rays (IR).

The via 20 may electrically connect the first IC 31a and the bolometer 10, and may be used as a transmission path of the electrical parameters (e.g., a resistance value, a current, a voltage, or the like) of the bolometer 10.

For example, the number of vias 20 may be n times the number of the plurality of bolometer cells in the bolometer 10 (where, n is a natural number), and a length of the vias 20 in a z-direction may be designed such that a separation distance between the reflective layer 15 and the bolometer 10 corresponds to ¼ of a wavelength of infrared rays (IR).

The first IC 31a may include at least one of a read-out (RO) element performing analog processing for the bolometer 10 to generate infrared sensing information and an image signal process (ISP) element performing digital processing based on the bolometer 10 to generate infrared image information.

For example, the RO element may include at least one of a bias providing circuit supplying a bias voltage (or a current) to each of the plurality of bolometer cells of the bolometer 10, a timing circuit controlling an exposure time period of the bolometer 10, and a sensing circuit converting and outputting thermal energy integrated during the exposure time period into the infrared sensing information (e.g., an analog voltage).

For example, the ISP element may include an analog-to-digital conversion circuit converting the infrared sensing information (e.g., analog voltage) into a digital value. The ISP element may include a non-uniformity correction (NUC) unit removing noise of the digital value and improving sensitivity uniformity of each location of the plurality of bolometer cells of the bolometer 10. The ISP element may include an image pipeline including a temperature calculation unit calculating a temperature of an object corresponding to infrared ray (IR), to generate infrared image information. The ISP element may include a serial transmission unit for transmitting infrared image information to an application processor. The serial transmission unit may use serial peripheral interface (SPI) communication or mobile industry processor interface (MIPI) communication. Depending on a design, the ISP element may further include at least one of a one-time-programmable (OTP) memory storing calibration data and a phase-locked loop (PLL) circuit generating a plurality of clocks.

In addition, the first IC 31a may include at least one of an autofocusing (AF) control element and an optical image stabilization (OIS) control element to adjust a positional relationship between the lens module and the bolometer 10.

For example, the AF control element may include an AF control logic in which a positional relationship between the lens module and the bolometer 10 is configured to generate a value corresponding to a distance by which the lens module moves in the z-direction (for example, an infrared direction), to optimize a focus of at least one lens that may be included in the lens module in a state in which the focus is not optimized. For example, the AF control logic may receive feedback of current position information and/or acceleration information of the lens module, and may generate a value corresponding to a distance by which the lens module moves in the z-direction by proportional-integral-derivative (PID) control.

The OIS control element may include an OIS control logic in which the lens module and/or bolometer 10 are configured to generate a value corresponding to a distance by which the lens module moves in the x-direction and/or the y-direction to optically correct occurrence of a blur in an infrared image, as moved in the x-direction and/or y-direction (e.g., in a direction perpendicular to the infrared ray) due to shaking of a person's hand. For example, the OIS control logic may receive feedback on current position information and/or acceleration information of the lens module, and may generate a value corresponding to a distance by which the lens module moves in the x-direction and/or y-direction by PID control.

Therefore, an infrared image sensor 40a according to an embodiment of the present disclosure may obtain clearer infrared image information. Since the first IC 31a may include the RO element and/or the ISP element, and may include the AF control element and the OIS control element, an infrared image sensor 40a according to an embodiment of the present disclosure may include one integrated circuit to obtain clear infrared image information, a size of the infrared image sensor 40a for obtaining the clear infrared image information may be reduced, and costs for implementing the infrared image sensor 40a for obtaining the clear infrared image information may be reduced.

According to use (e.g., as a portable terminal, an installation type camera, or the like) or specifications (e.g., resolution, frame frequency of an image, color realization, usage of HDR, or the like) of the infrared image sensor 40a or the infrared camera module 80a, the first IC (31a) may include only one of the AF control element and the OIS control element, or may include both of the AF control element and the OIS control element.

The first IC 31a may output infrared image information outside the first IC 31a, and may output a value corresponding to a distance by which the lens module moves, outside the first IC 31a. For example, the first IC 31a may transmit infrared image information to an application processor by a first pin, and may transmit a value corresponding to a distance by which the lens module moves, to a driver 53a by a second pin.

The driver 53a may be disposed on a substrate 55 or 55a. For example, the driver 53a may include a coil, may receive a driving current corresponding to a distance by which the lens module moves from the first IC 31a, and may be interacted with a magnetic structure that may be disposed in the lens module by Lorentz force, to drive the lens module.

A sensor 57a may be disposed on the substrate 55 or 55a, and may sense position information and acceleration information of the lens module. For example, the sensor 57a may include a Hall sensor, and may sense a magnetic flux formed by the magnetic structure that may be disposed in the lens module, to sense a position of the lens module, and may include a gyro sensor to sense acceleration of the lens module.

At least one of the AF control element and the OIS control element of the first IC 31a may receive a detection result from the sensor 57a, and may output a value corresponding to a distance by which the lens module moves, based on the detection result from the sensor 57a, outside the first IC 31a. An actuator 50 may include the driver 53a, sensor 57a, and substrate 55 or 55a.

Referring to FIG. 3A, the sensor 57a illustrated in FIG. 1 may include an acceleration sensor 57b and/or a position sensor 57c, and the first IC 31a may transmit infrared image information outside the first IC 31a (e.g., to an application processor and an interface), and a value corresponding to a distance by which the lens module moves (e.g., a driving current flowing through a coil) may be provided to the driver 53.

Figure 2A:
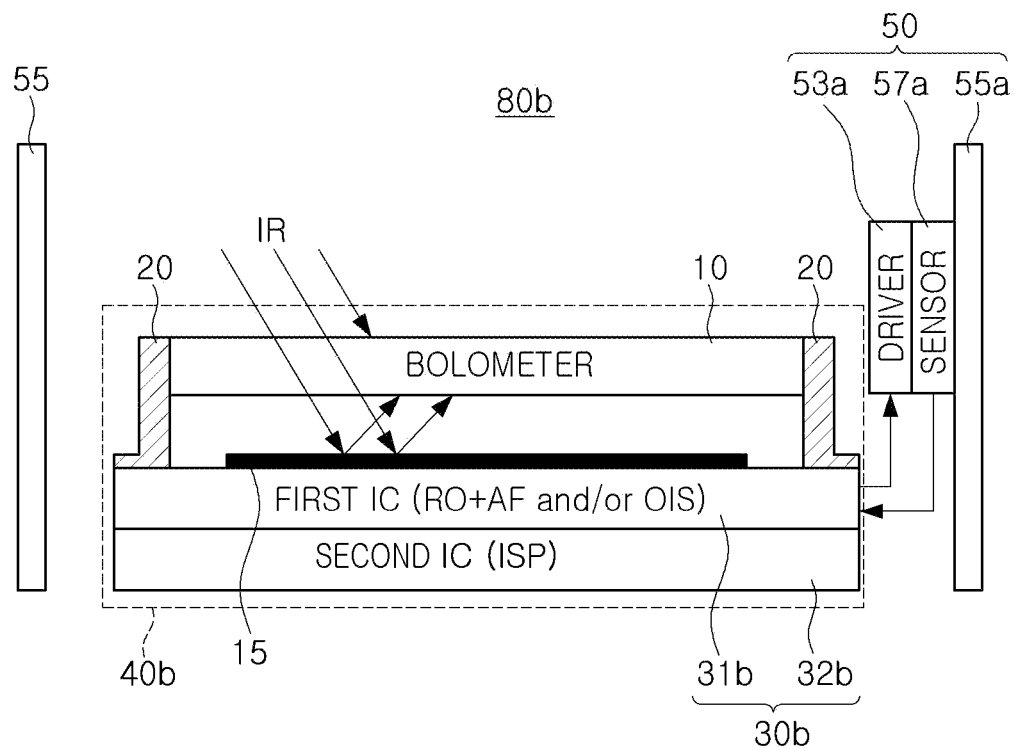
FIGS. 2A to 2D are views illustrating a structure in which an integrated circuit (IC) of an infrared image sensor according to an embodiment of the present disclosure is provided in plural.
Figure 2B:
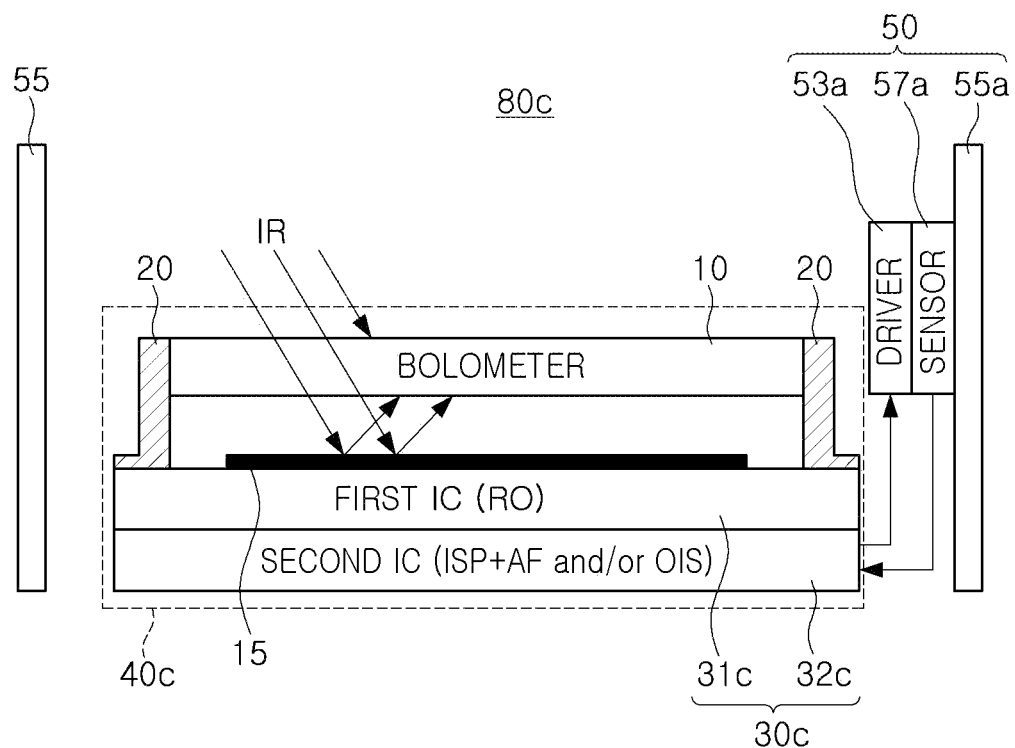
Figure 2C:
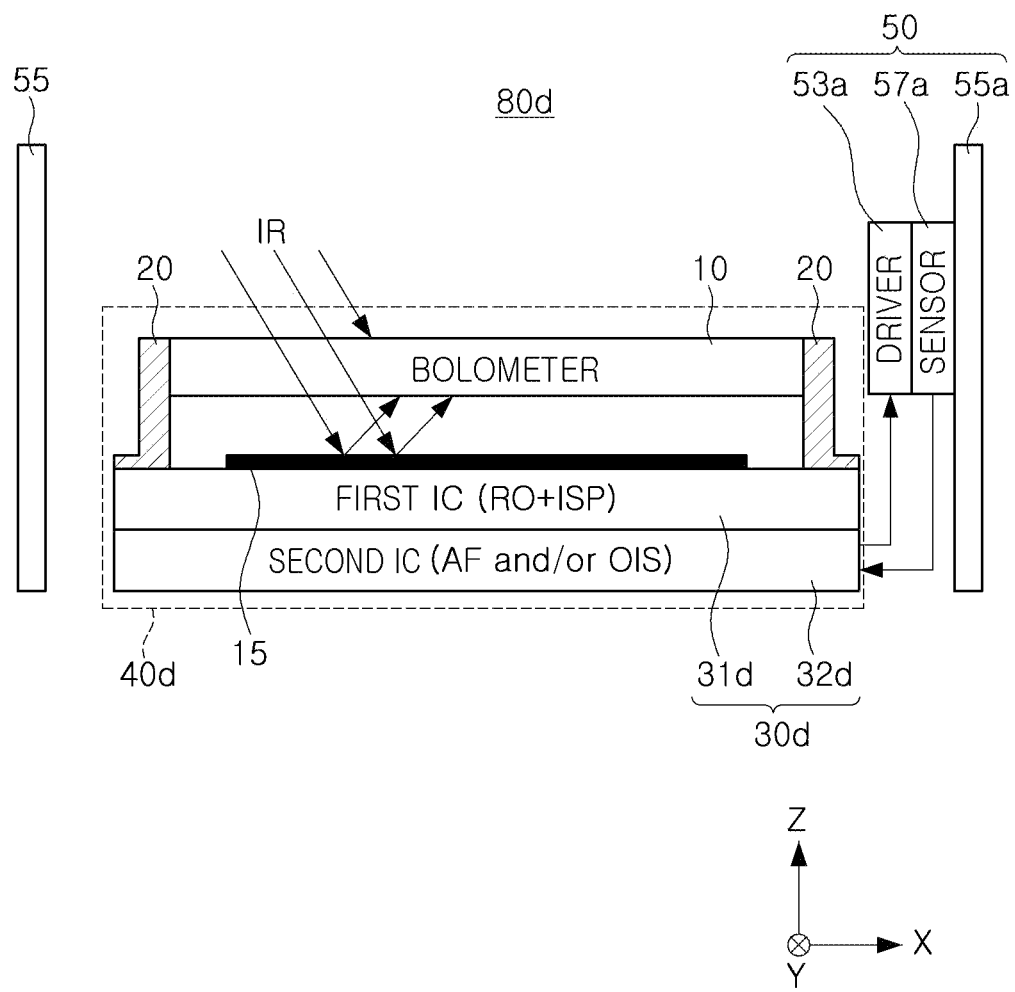
Figure 2D:
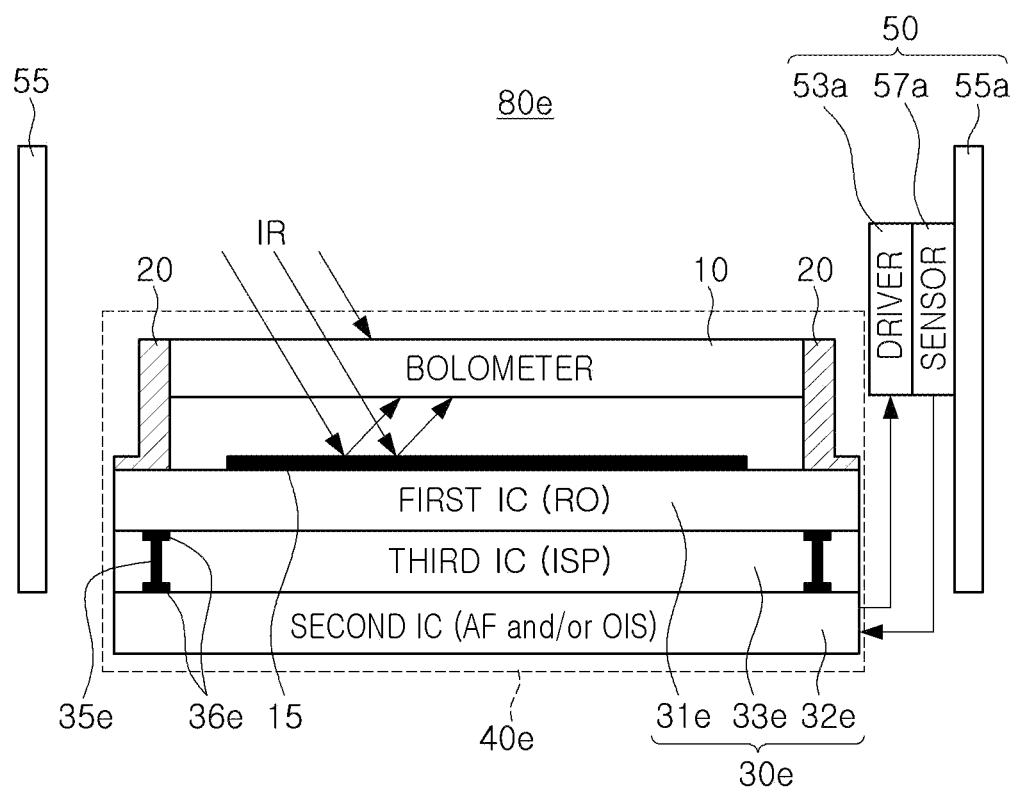
Figure 3B:
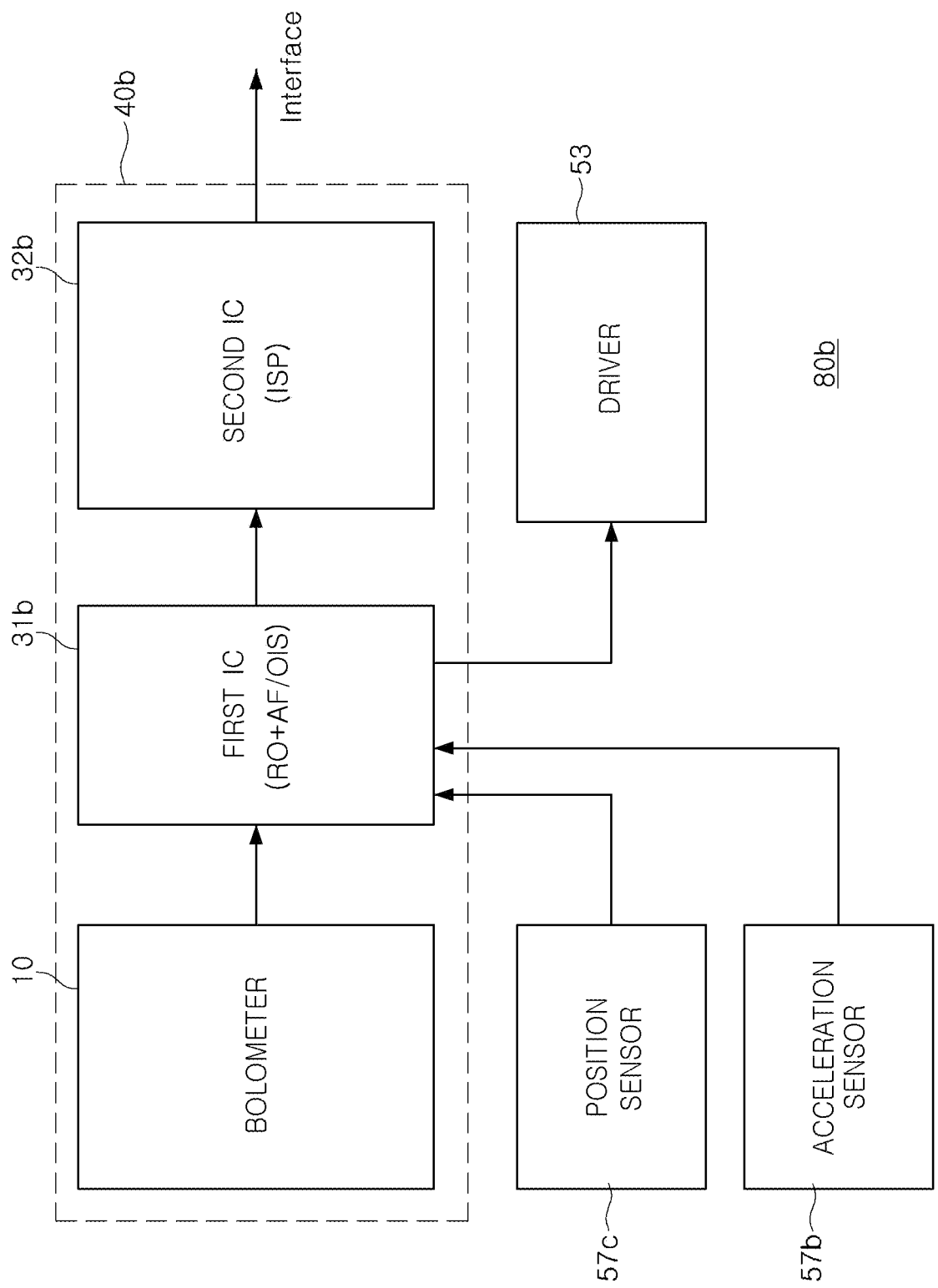
FIG. 3B is a block diagram illustrating the infrared image sensor illustrated in FIG. 2A.

FIGS. 2A to 2D are views illustrating a structure in which an integrated circuit (IC) of an infrared image sensor according to an embodiment of the present disclosure is provided in plural, and FIG. 3B is a block diagram illustrating the infrared image sensor illustrated in FIG. 2A.

Referring to FIG. 2A, an infrared camera module 80b according to an embodiment of the present disclosure may include an infrared image sensor 40b according to an embodiment of the present disclosure, and the infrared image sensor 40b may include a plurality of ICs 30b, stacked on each other.

For example, a plurality of ICs 30b may be coupled to each other through a conductive pad or a through-silicon-via (TSV) disposed between the plurality of ICs 30b without interposing a substrate such as a printed circuit therebetween.

Therefore, a size of the plurality of ICs 30b may not be substantially different from a size of the first IC 31a illustrated in FIG. 1. For example, when a length of the plurality of ICs 30b in the z-direction is longer than a length of the first IC 31a illustrated in FIG. 1 in the z-direction, a size of the plurality of ICs 30b in the x-direction and/or y-direction may be smaller than a size of the first IC 31a illustrated in FIG. 1 in the x-direction and/or y-direction.

The plurality of ICs 30b may include a first IC 31b and a second IC 32b disposed on a lower surface of the first IC 31b. The first IC 31b may include a read-out (RO) element, may include an AF control element and/or an OIS control element, and may output a value corresponding to a distance by which the lens module moves, outside the first IC 31b. The second IC 32b may include at least a portion of the ISP element of the first IC 31a illustrated in FIG. 1, instead of the first IC 31b, and may receive infrared sensing information from the first IC 31b, and may output the infrared image information outside the second IC 32b.

Referring to FIG. 3B, the first IC 31b may provide a value corresponding to a distance by which the lens module moves (e.g., a driving current flowing through a coil) to a driver 53, and may provide infrared sensing information to the second IC 32b, and the second IC 32b may transmit the infrared image information outside the second IC 32b (e.g., to an application processor and an interface).

Referring to FIG. 2B, an infrared camera module 80c according to an embodiment of the present disclosure may include an infrared image sensor 40c according to an embodiment of the present disclosure, and the infrared image sensor 40c may include a plurality of ICs 30c, stacked on each other. The plurality of ICs 30c may include a first IC 31c and a second IC 32c.

The first IC 31c may include an RO element, and may provide infrared sensing information corresponding to a processing result of the RO element, or a processing result of a portion of an ISP element, to the second IC 32c. The second IC 32c may include at least a portion of the ISP element, may include an AF control element and/or an OIS control element, and may output the infrared image information and a value corresponding to a distance by which the lens module moves, outside the second IC 32c.

Referring to FIG. 2C, an infrared camera module 80d according to an embodiment of the present disclosure may include an infrared image sensor 40d according to an embodiment of the present disclosure, and the infrared image sensor 40d may include a plurality of ICs 30d, stacked on each other. The plurality of ICs 30d may include a first IC 31d and a second IC 32d.

The first IC 31d may include an RO element and/or an ISP element, and may output infrared image information outside the first IC 31d. The second IC 32d may include an AF control element and/or an OIS control element, and may output a value corresponding to a distance by which the lens module moves outside the second IC 32d.

Referring to FIG. 2D, an infrared camera module 80e according to an embodiment of the present disclosure may include an infrared image sensor 40e according to an embodiment of the present disclosure, and the infrared image sensor 40e may include a plurality of ICs 30e, stacked on each other. The plurality of ICs 30e may include a first IC 31e, a second IC 32e, and a third IC 33e.

The third IC 33e may be stacked on one of the first and second ICs 31e and 32e, or may be stacked between the first and second ICs 31e and 32e. For example, the third IC 33e may be electrically connected to the first and second ICs 31e and 32e through a TSV 35e or a conductive pad 36e.

The first IC 31e may include an RO element, and may provide infrared sensing information to the third IC 33e. The second IC 32e may include an AF control element and/or an OIS control element, and may output a value corresponding to a distance by which the lens module moves, outside the second IC 32e. The third IC 33e may include an ISP element, and may output infrared image information outside the third IC 33e.

Figure 4A:
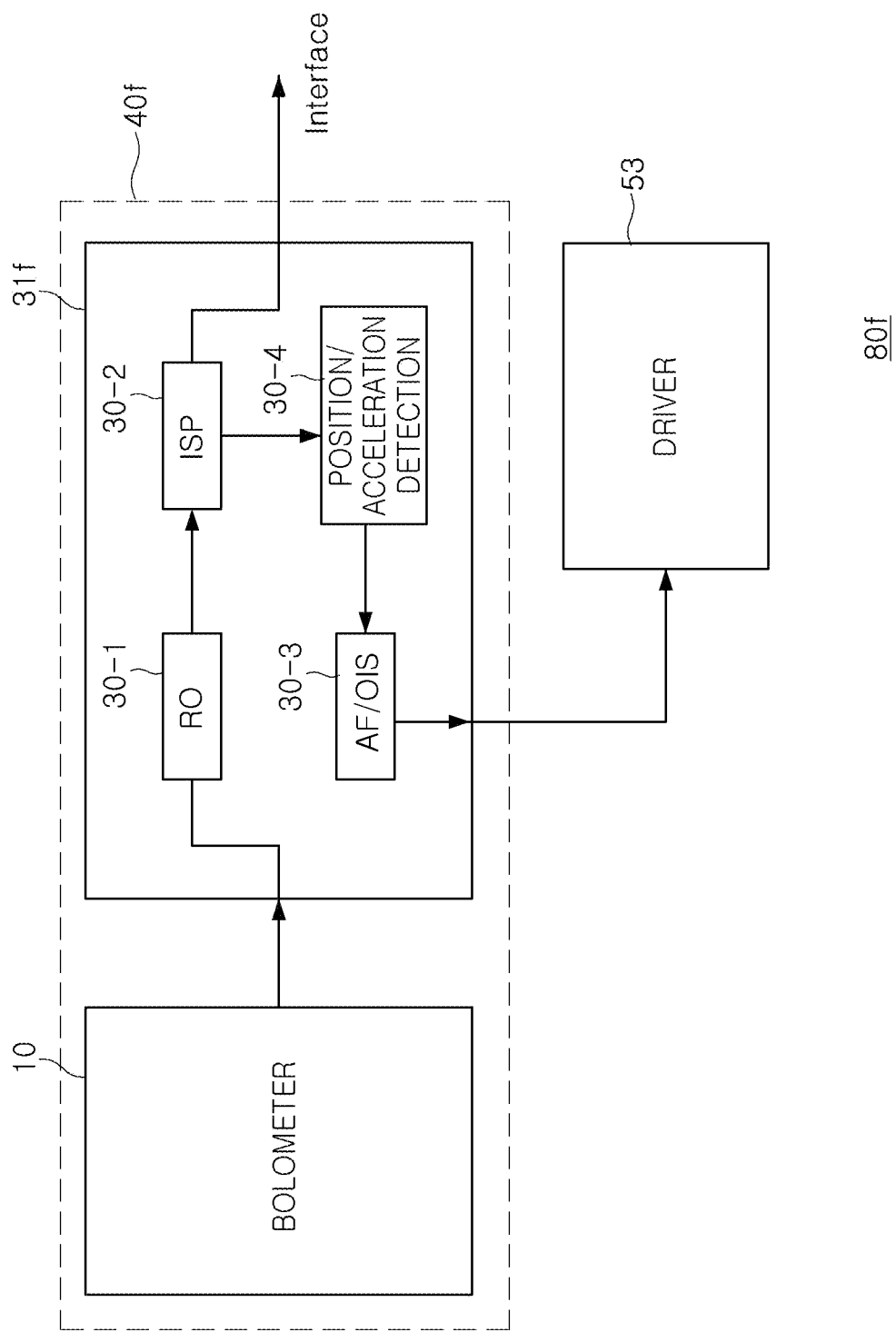
FIGS. 4A and 4B are block diagrams illustrating a modified structure for extracting position/acceleration information that may be used for an AF/OIS control element of an infrared image sensor according to an embodiment of the present disclosure.
Figure 4B:
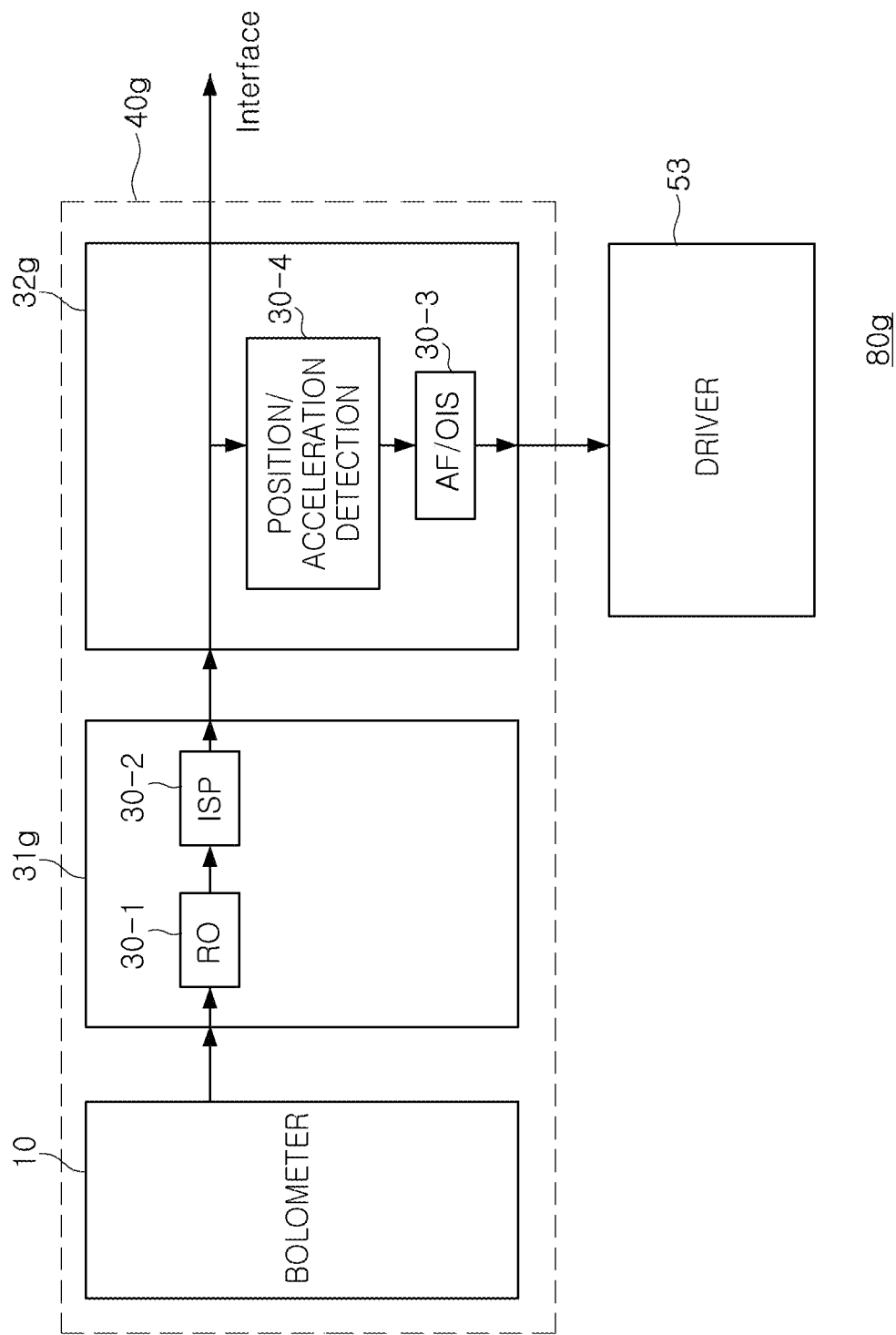

FIGS. 4A and 4B are block diagrams illustrating a modified structure for extracting position/acceleration information that may be used for an AF/OIS control element of an infrared image sensor according to an embodiment of the present disclosure.

Referring to FIG. 4A, an infrared camera module 80f according to an embodiment of the present disclosure may include an infrared image sensor 40f according to an embodiment of the present disclosure, and a first IC 31f may include an RO element 30-1, an ISP element 30-2, and an AF/OIS element 30-3.

For example, the ISP element 30-2 may include a position/acceleration detection element 30-4. The position/acceleration detection element 30-4 may extract position information and/or acceleration information of a lens module based on infrared sensing information generated by the RO element 30-1 and/or infrared image information generated by the ISP element 30-2.

For example, the position/acceleration detection element 30-4 may generate the position information corresponding to a distance between a position of a specific pixel of the infrared image information at time (t) and a position of a specific pixel of the infrared image information at time (t+1), and may generate the acceleration information based on a relationship between a position of a specific pixel at time (t), a position of a specific pixel at time (t+1), and a position of a specific pixel at time (t−1).

Therefore, an infrared camera module 80f according to an embodiment of the present disclosure may omit the position sensor and/or the acceleration sensor, according to a design.

The AF/OIS element 30-3 may provide a value corresponding to a distance by which the lens module moves, based on the position information and/or acceleration information generated by the position/acceleration detection element 30-4, to a driver 53.

Referring to FIG. 4B, an infrared camera module 80g according to an embodiment of the present disclosure may include an infrared image sensor 40g according to an embodiment of the present disclosure, and a first IC 31g may include an RO element 30-1 and an ISP element 30-2, and a second IC 32g may include an AF/OIS element 30-3 and a position/acceleration detection element 30-4. The position/acceleration detection element 30-4 may be a portion of the ISP element 30-2.

Figure 5:
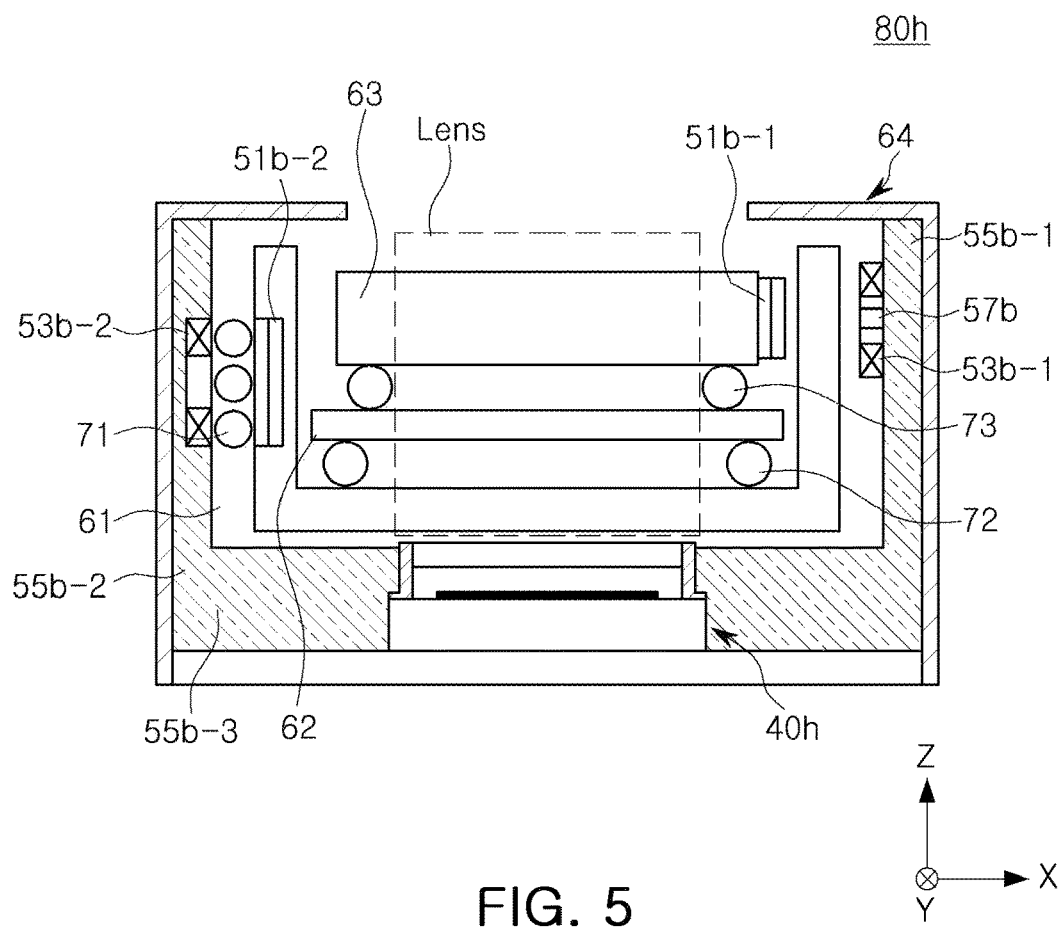
FIG. 5 is a side view illustrating an infrared image sensor and an infrared camera module, according to an embodiment of the present disclosure.

FIG. 5 is a side view illustrating an infrared image sensor and an infrared camera module, according to an embodiment of the present disclosure.

Referring to FIG. 5, an infrared camera module 80h according to an embodiment of the present disclosure may include an infrared image sensor 40h according to an embodiment of the present disclosure.

The infrared camera module 80h may include a substrate having a first portion 55b-1, a second portion 55b-2, and a third portion 55b-3. For example, the substrate may be implemented as a flexible printed circuit board (FPCB), and normal directions of upper surfaces of the first, second, and third portions 55b-1, 55b-2, and 55b-3 may be bent to be different directions. The substrate may be surrounded by a shield case 64.

The infrared image sensor 40h may be disposed in the third portion 55b-3 of the substrate, and may be electrically connected to a wiring of the substrate.

A first driver 53b-1 may be disposed on the first portion 55b-1 of the substrate, may receive a value generated based on an OIS element by the infrared image sensor 40h and the substrate, and may form first driving force for a lens module 63 according to the received value. In this case, ball bearings 72 and 73 may rotate by the first driving force, and the lens module 63 may move in the x-direction and/or the y-direction by the rotation of the ball bearings 72 and 73. The first driver 53b-1 may include a first coil, and may interact with a first magnetic body 51b-1 disposed on the lens module 63, to generate the first driving force.

A second driver 53b-2 may be disposed on the second portion 55b-2 of the substrate, may receive a value generated based on an AF element by the infrared image sensor 40h and the substrate, and may form second driving force for the lens module 63 according to the received value. In this case, a ball bearing 71 may rotate by the second driving force, and the lens module 63 may move in the z-direction by the rotation of the ball bearing 71. The second driver 53b-2 may include a second coil, and may interact with a second magnetic body 51b-2 disposed on the lens module 63, to generate the second driving force.

A frame 62 may support the ball bearings 71, 72, and 73 to move the lens module 63 according to rotation of the ball bearings 71, 72, and 73.

Figure 6:
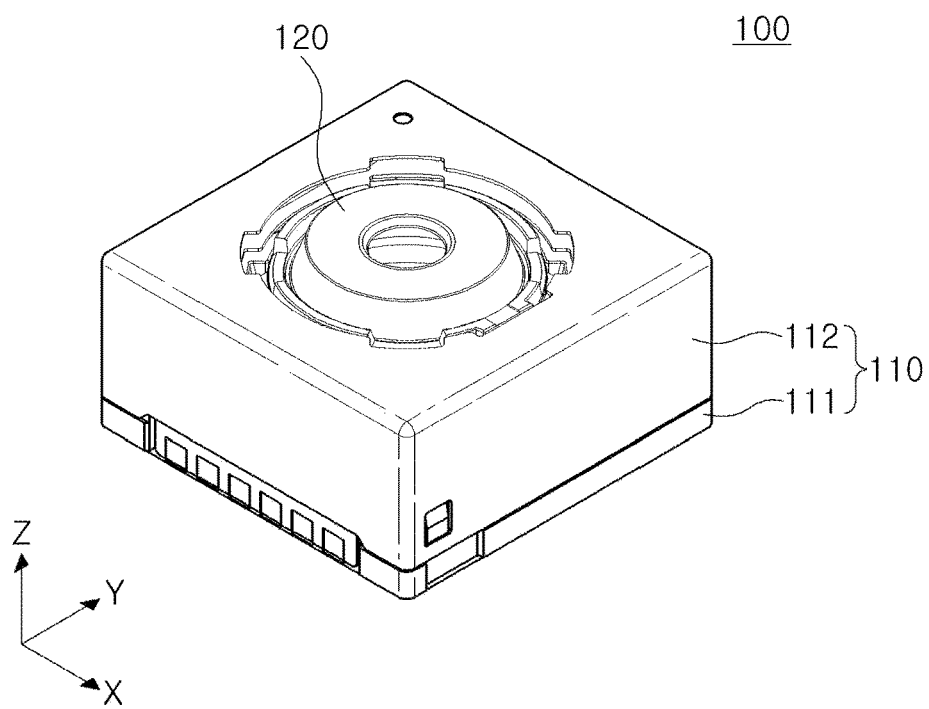
FIG. 6 is a combined perspective view of an infrared camera module according to an embodiment of the present disclosure.

FIG. 6 is a combined perspective view of an infrared camera module according to an embodiment of the present disclosure.

Referring to FIG. 6, an infrared camera module 100 may include a housing unit 110 and a lens barrel 120, and the housing unit 110 may include a housing 111 and a shield case 112. The infrared camera module 100 may include at least one of an autofocusing control function and a hand-shake correction function. For example, in order for the infrared camera module 100 to perform an autofocusing control function and a hand-shake correction function, the lens barrel 120 may move inside the housing unit 110 in an optical axis direction and a direction, perpendicular to an optical axis, respectively.

Figure 7:
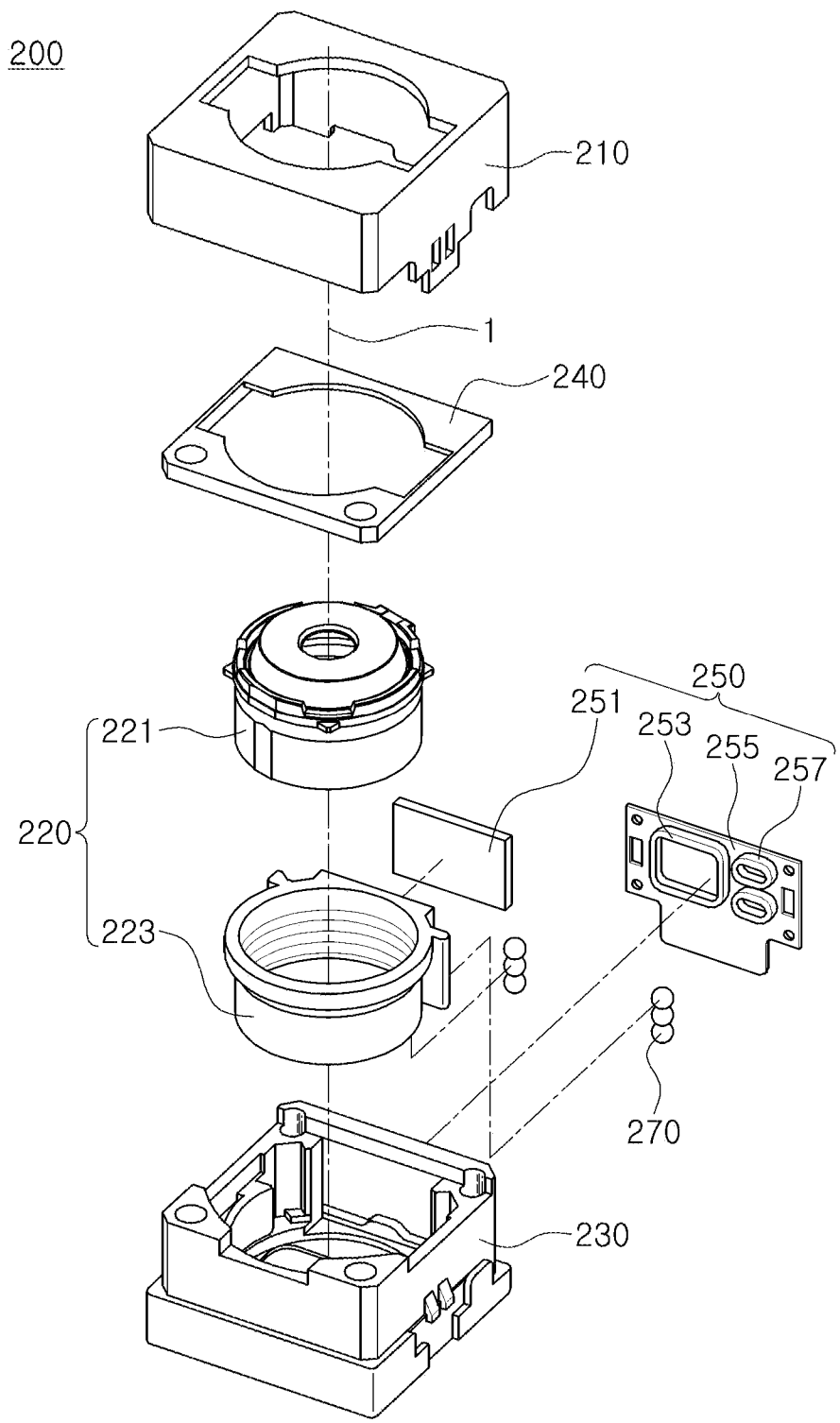
FIG. 7 is an exploded perspective view of an infrared camera module according to an embodiment of the present disclosure.

FIG. 7 is an exploded perspective view of an infrared camera module according to an embodiment of the present disclosure.

Referring to FIG. 7, an infrared camera module 200 according to an embodiment of the present disclosure may include a shield case 210, a lens module 220, a housing 230, a stopper 240, an actuator 250, and a ball bearing unit 270.

The lens module 220 may include a lens barrel 221, and a lens holder 223 accommodating the lens barrel 221 therein.

The lens barrel 221 may have a hollow cylindrical shape to accommodate a plurality of lenses for capturing an object therein, and the plurality of lenses may be provided in the lens barrel 221 in an optical axis direction 1. The plurality of lenses may be stacked as many times as necessary according to a design of the lens module 220, and may have the same or different optical characteristics such as refractive index, respectively.

The lens barrel 221 may be coupled to the lens holder 223. For example, the lens barrel 221 may be inserted into a hollow provided in the lens holder 223, the lens barrel 221 and the lens holder 223 may be coupled by a screw connection method or by an adhesive. The lens module 220 may be accommodated in the housing 230, and may be moved in the optical axis direction 1 for autofocusing control.

The actuator 250 may drive the lens module 220 in the optical axis direction 1. To move the lens module 220 in the optical axis direction 1, the actuator 250 may include a magnet 251 mounted on one side of the lens holder 223, and a driving coil 253 disposed to oppose the magnet 251. The driving coil 253 may be mounted on a substrate 255, and the substrate 255 may be mounted on the housing 230 such that the driving coil 253 opposes the magnet 251.

The actuator 250 may apply a driving signal to the driving coil 253. The actuator 250 may have an H bridge circuit capable of driving in both directions, and may apply a driving signal to the driving coil 253 by a voice coil motor method.

The actuator 250 may apply a driving signal to the driving coil 253, to move the lens module 220 in the optical axis direction 1. Specifically, the actuator 250 may apply a driving signal to the driving coil 253, to provide driving force to the magnet 251, and the lens module 220 may move in the optical axis direction 1 by the driving force of the magnet 251. When the driving signal is provided to the driving coil 253, a magnetic flux may be generated in the driving coil 253, and the magnetic flux of the driving coil 253 may interact with a magnetic field of the magnet 251, to generate driving force for moving the lens module 220 in the optical axis direction 1 according to Fleming's left-hand rule.

The magnet 251 may include a first magnetic body and a second magnetic body. The first magnet and the second magnet may be formed by polarizing the magnet 251, and accordingly, the lens module 220 may easily move. The magnet 251 may be used for the actuator 250 to detect a position of the lens module 220.

The actuator 250 may include a sensing coil 257 opposing the magnet 251 and mounted on the substrate 255. The sensing coil 257 may be disposed outside the driving coil 253, and as illustrated in FIG. 7, the sensing coil 257 may be provided as at least one coil.

Inductance of the sensing coil 257 may be changed according to a change in position of the magnet 251. Specifically, when the magnet 251 moves in one direction, intensity of a magnetic field of the magnet 251 affecting the inductance of the sensing coil 257 may be changed, and accordingly, the inductance of the sensing coil 257 may be changed.

The actuator 250 may determine displacement of the lens module 220 due to a change in inductance of the sensing coil 257. For example, the actuator 250 may additionally include at least one capacitor, and the at least one capacitor and the sensing coil 257 may form a predetermined oscillation circuit. For example, the at least one capacitor may be provided to correspond to the number of the sensing coils 257, and one capacitor and one sensing coil 257 may be configured to have the same form as a predetermined LC oscillator. In addition to the above, at least one capacitor and the sensing coil 257 may be configured to have the same form as a Colpitts oscillator, widely known in the art.

The actuator 250 may determine displacement of the lens module 220 due to a change in frequency of an oscillation signal generated by an oscillation circuit. Specifically, when inductance of the sensing coil 257 forming the oscillation circuit is changed, the frequency of the oscillation signal generated by the oscillation circuit may be changed, and thus the displacement of the lens module 220 may be detected based on the change in frequency.

As a guide means for guiding movement of the lens module 220 when the lens module 220 moves within the housing 230 in the optical axis direction 1, the ball bearing unit 270 may be provided. The ball bearing unit 270 may include one or more ball bearings. When a plurality of ball bearings are provided, the plurality of ball bearings may be disposed in the optical axis direction 1. The ball bearing unit 270 may be in contact with an outer surface of the lens holder 223 and an inner surface of the housing 230, to guide movement of the lens module 220 in the optical axis direction 1. For example, the ball bearing unit 270 may be disposed between the lens holder 223 and the housing 230, and may guide movement of the lens module 220 by rolling motion in the optical axis direction.

The stopper 240 may be mounted on the housing 230 to limit a moving distance of the lens module 220. For example, the stopper 240 may be mounted on an upper portion of the housing 230, and the stopper 240 and the lens module 220 may be arranged to be spaced apart in the optical axis direction, when no power is applied to the driving coil 253. Therefore, when power is applied to the driving coil 253 to move the lens module 220 in the optical axis direction, a moving distance of the lens module 220 may be limited by the stopper 240, such that the lens module 220 may move within a range of a gap with the stopper 240. When the stopper 240 and the lens module 220 collide with each other, the stopper 240 may be formed of a material having elasticity to alleviate collision impacts.

The shield case 210 may be coupled to the housing 230 to surround the outer surface of the housing 230, and may function to shield electromagnetic waves generated during driving of the infrared camera module.

When the infrared camera module is driven, electromagnetic waves may be generated. When such electromagnetic waves are emitted externally, the electromagnetic waves may affect other electronic components to cause communication failures or malfunctions. To prevent this, the shield case 210 may be formed of a metal material, and may be grounded to a ground pad of a substrate mounted on a lower portion of the housing 230, to shield the electromagnetic waves. When the shield case 210 is provided as a plastic injection material, a conductive paint may be applied to an inner surface of the shield case 210, to shield the electromagnetic waves. A conductive epoxy may be used as the conductive paint, but the present disclosure is not limited thereto. Various materials having conductivity may be used as the conductive paint, and a method of attaching a conductive film or a conductive tape to the inner surface of the shield case 210 may also be used.

Figure 8:
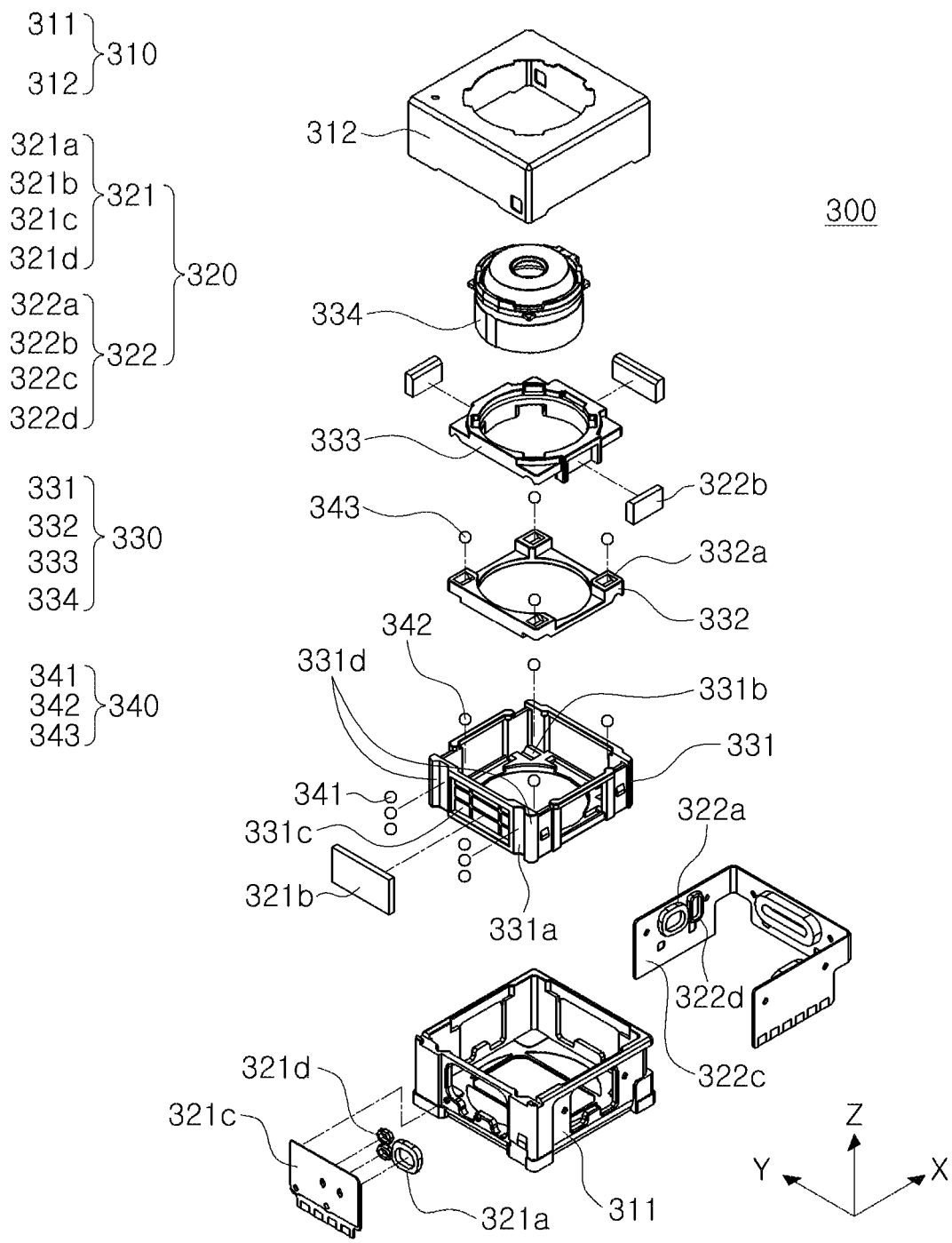
FIG. 8 is an exploded perspective view of an infrared camera module according to another embodiment of the present disclosure.

FIG. 8 is an exploded perspective view of an infrared camera module according to another embodiment of the present disclosure.

Referring to FIG. 8, an infrared camera module 300 according to another embodiment of the present disclosure may include a housing unit 310, an actuator unit 320, and a lens module 330.

The housing unit 310 may include a housing 311 and a shield case 312. The housing 311 may be formed of a material that may be easily molded. For example, the housing 311 may be formed of a plastic material. One or more actuator units 320 may be mounted on the housing 311. For example, a portion of a first actuator 321 may be mounted on a first side surface of the housing 311, and a portion of a second actuator 322 may be mounted on second to fourth side surfaces of the housing 311. The housing 311 may be configured to accommodate the lens module 330 therein. For example, a space in which the lens module 330 is fully or partially accommodated may be formed inside the housing 311.

The housing 311 may have six (6) surfaces, which are open. For example, a hole for mounting an infrared image sensor may be formed on a lower surface of the housing 311, and a hole for mounting the lens module 330 may be formed on an upper surface of the housing 311. In addition, a hole into which a first driving coil 321a of the first actuator 321 is inserted may be formed on the first side surface of the housing 311, and a hole into which a second driving coil 322a of the second actuator 322 is inserted may be formed on second to fourth side surfaces of the housing 311.

The shield case 312 may be configured to cover a portion of the housing 311. For example, the shield case 312 may be configured to cover the upper surface and the four (4) side surfaces of the housing 311. In addition, unlike this, the shield case 312 may be configured to cover only the four (4) side surfaces of the housing 311, or the shield case 312 may be configured to partially cover the upper surface and the four (4) side surfaces of the housing 311.

The actuator unit 320 may include a plurality of actuators. For example, the actuator unit 320 may include a first actuator 321 configured to move the lens module 330 in the Z-axis direction, and a second actuator 322 configured to move the lens module 330 in the X-axis direction and the Y-axis direction.

The first actuator 321 may be mounted on the housing 311 and a first frame 331 of the lens module 330. For example, a portion of the first actuator 321 may be mounted on the first side surface of the housing 311, and a remaining portion of the first actuator 321 may be mounted on a first side surface of the first frame 331. The first actuator 321 may move the lens module 330 in the optical axis direction (in the Z-axis direction in FIG. 8). For example, the first actuator 321 may include a first driving coil 321a, a first magnet 321b, a first substrate 321c, and at least one first sensing coil 321d. The first driving coil 321a and the at least one first sensing coil 321d may be formed on the first substrate 321c. The first substrate 321c may be mounted on the first side surface of the housing 311, and the first magnet 321b may be mounted on the first side surface of the first frame 331 opposing the first substrate 321c.

The first actuator 321 may apply a driving signal to the first driving coil 321a. The first actuator 321 may have an H bridge circuit capable of driving in both directions and may apply a driving signal to the first driving coil 321a by a voice coil motor method. When the driving signal is applied to the first driving coil 321a, a magnetic flux may be generated in the first driving coil 321a. The magnetic flux of the first driving coil 321a may interact with a magnetic field of the first magnet 321b, to generate driving force that enables relative movement of the first frame 331 and the lens barrel 334 with respect to the housing 311. Similar to the actuator 250 of FIG. 7, the first actuator 321 may determine displacement of the lens barrel 334 and the first frame 331 due to a change in inductance of the at least one first sensing coil 321d. As illustrated, the first magnet 321b may be disposed on one surface 331c of the first frame 331, and unlike this, the first magnet 321b may be disposed on one of edges 331d of the first frame 331.

The second actuator 322 may be mounted on the housing 311 and a third frame 333 of the lens module 330. For example, a portion of the second actuator 322 may be mounted on the second to fourth side surfaces of the housing 311, and a remaining portion of the second actuator 322 may be mounted on second to fourth side surfaces of the third frame 333. Alternatively, the second actuator 322 may be mounted on second to fourth edges where the housing 311 and first to fourth side surfaces of the third frame 333 are in contact with each other. In the above description, it has been described that the second actuator 322 may be formed on both the second to fourth sides or the second to fourth edges, but the actuators formed on the respective side surfaces or the respective edges may provide independently driving force to the lens module 330. Therefore, the second actuator 322 may be formed on a portion of the second to fourth side surfaces, depending on an embodiment. Hereinafter, for convenience of explanation, it may be assumed that an actuator formed on the second side surface may be the second actuator 322. However, the following description may be applied to actuators formed on other side surfaces or other edges.

The second actuator 322 may move the lens barrel 334 in a direction perpendicular to the optical axis. For example, the second actuator 322 may include a second driving coil 322a, a second magnet 322b, a second substrate 322c, and at least one second sensing coil 322d. The second driving coil 322a and the at least one second sensing coil 322d may be formed on the second substrate 322c. The second substrate 322c may be generally formed to have a 'C' shape, and may be mounted to surround the second to fourth side surfaces of the housing 311. The second magnet 322b may be mounted on the second to fourth side surfaces of the third frame 333 to oppose the second substrate 322c.

The second actuator 322 may change magnitude and direction of magnetic force generated between the second drive coil 322a and the second magnet 322b, to enable relative movement of a second frame 332 or the third frame 333. The lens barrel 334 may move in the same direction as the second frame 332 or the third frame 333 by the movement of the second frame 332 or the third frame 333.

The second actuator 322 may detect a position of the second frame 332 or a position of the third frame 333, from a change in inductance of the at least one second sensing coil 322d, similar to the actuator 250 of FIG. 7.

The lens module 330 may be mounted on the housing unit 310. For example, the lens module 330 may be accommodated in a storage space formed by the housing 311 and the shield case 312, to be movable in at least three axis directions.

The lens module 330 may include a plurality of frames. For example, the lens module 330 may include a first frame 331, a second frame 332, and a third frame 333. The first frame 331 may move with respect to the housing 311. For example, the first frame 331 may move in the optical axis direction (the Z-axis direction) of the housing 311 by the first actuator 321 described above. A plurality of guide grooves 331a and 331b may be formed in the first frame 331. For example, a first guide groove 331a extending in the optical axis direction (the Z-axis direction) may be formed on the first side surface of the first frame 331, for example, a first guide groove 331a may be formed on two (2) edges of the first side surface of the first frame 331, respectively. For example, a second guide groove 331b extending in a first horizontal direction (the Y-axis direction) of the optical axis may be formed on four (4) edges of an inner bottom surface of the first frame 331, respectively. The first frame 331 may be manufactured to have a form in which at least three side surfaces are open. For example, the second to fourth side surfaces of the first frame 331 may be open such that the second magnet 322b of the third frame 333 and the second driving coil 322a of the housing 311 oppose each other.

The second frame 332 may be mounted on the first frame 331. For example, the second frame 332 may be mounted in an internal space of the first frame 331. The second frame 332 may move in the first horizontal direction (the Y-axis direction) of the optical axis with respect to the first frame 331. For example, the second frame 332 may move in the first horizontal direction (the Y-axis direction) of the optical axis along the second guide groove 331b of the first frame 331. A plurality of guide grooves 332a may be formed in the second frame 332. For example, four (4) third guide grooves 332a extending in a second horizontal direction (the X-axis direction) of the optical axis may be formed on edges of the second frame 332.

The third frame 333 may be mounted on the second frame 332. For example, the third frame 333 may be mounted on an upper surface of the second frame 332. The third frame 333 may be configured to move in the second horizontal direction (the X-axis direction) of the optical axis with respect to the second frame 332. For example, the third frame 333 may move in the second horizontal direction (the X-axis direction) of the optical axis along the third guide groove 332a of the second frame 332. A plurality of second magnets 322b may be mounted on the third frame 333. For example, at least two second magnets 322b may be mounted on the second to fourth side surfaces of the third frame 333, respectively, and, for example, three (3) second magnets 322b may be mounted on the second to fourth side surfaces of the third frame 333, respectively.

The third frame 333 described above may be integrally formed with the second frame 332. In this case, the third frame 333 may be omitted, and the second frame 332 may move in the first horizontal direction (the Y-axis direction) and the second horizontal direction (the X-axis direction) of the optical axis.

The lens module 330 may include a lens barrel 334. For example, the lens module 330 may include a lens barrel 334 including one or more lenses. The lens barrel 334 may be mounted on the third frame 333. For example, the lens barrel 334 may be inserted into the third frame 333 to move integrally with the third frame 333. The lens barrel 334 may move in the optical axis direction (the Z-axis direction) and in the horizontal directions (the X-axis direction and the Y-axis direction) of the optical axis. For example, the lens barrel 334 may move in the optical axis direction (the Z-axis direction) by the first actuator 321, and may move in the horizontal directions (the X-axis direction and the Y-axis direction) of the optical axis by the second actuator 322.

A ball bearing unit 340 may guide movement of the lens module 330. For example, the ball bearing unit 340 may be configured to smoothly move the lens module 330 in the optical axis direction and in the horizontal directions of the optical axis. The ball bearing unit 340 may include a first ball bearing 341, a second ball bearing 342, and a third ball bearing 343. For example, the first ball bearing 341 may be disposed in the first guide groove 331a of the first frame 331, to smoothly move the first frame 331 in the optical axis direction. As another example, the second ball bearing 342 may be disposed in the second guide groove 331b of the first frame 331, to smoothly move the second frame 332 in the first horizontal direction of the optical axis. As another example, the third ball bearing 343 may be disposed in the third guide groove 332a of the second frame 332, to smoothly move the third frame 333 in the second horizontal direction of the optical axis.

The first ball bearings 341 may have at least three balls disposed in the first guide groove 331a, or when more than one first guide groove 331a, the first ball bearings 341 may have at least three (3) balls disposed in each of the first guide grooves 331a. In addition, each of the second and third ball bearings 342 and 343 may have four (4) balls, and the four (4) balls of each ball bearing may be disposed in the second or third guide grooves 331b and 332a, respectively.

Lubricating materials for reducing friction and noise may be filled in all portions in which the ball bearing unit 340 is disposed. For example, a viscous fluid may be injected into each of the guide grooves 331a, 331b, and 332a. As the viscous fluid, grease having excellent viscosity and lubrication properties may be used.

According to the one or more embodiments of the present disclosure, an infrared image sensor and an infrared camera module may obtain clear infrared sensing information and/or infrared image information, and may reduce a size and/or costs for implementation thereof.

The infrared camera module, infrared image sensor, bolometer, first IC, second IC, third IC, driver, interface, RO element, ISP element, AF element, OIS element, AF control element, OIS control element, AF/OIS element, AF/OIS control element, control element, acceleration detection element, position detection element, position/acceleration detection element, position sensor, acceleration sensor, infrared image sensor, object detectors, moving object detecting apparatuses, processors, memories, depth sensors, color sensors, and other apparatuses, devices, units, modules, and components described herein with respect to FIGS. 1-8 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, circuits and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

While specific example embodiments have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An infrared image sensor comprising:
    a first integrated circuit (IC);
    a bolometer disposed on or above one surface of the first IC configured to detect infrared rays passing through a lens module;
    a via electrically connecting the first IC and the bolometer; and
    a reflective layer disposed between the first IC and the bolometer,
    wherein the first IC comprises:
        at least one of a read-out (RO) element configured to perform analog processing for the bolometer to generate infrared sensing information and an image signal process (ISP) element configured to perform digital processing based on the bolometer to generate infrared image information; and
        at least one of an autofocusing (AF) control element and an optical image stabilization (OIS) control element configured to adjust a positional relationship between the lens module and the bolometer.

2. The infrared image sensor of claim 1, further comprising a second IC disposed on an other surface of the first IC opposite the one surface of the first IC,
    wherein the second IC comprises at least a portion of the ISP element, and is configured to output the infrared image information outside the second IC, and
    wherein the first IC is configured to output a value corresponding to a distance by which the lens module is to move, outside the first IC.

3. The infrared image sensor of claim 1, wherein the first IC comprises the RO element and the ISP element, and
    wherein the ISP element is configured to convert and digitally process the infrared sensing information into a digital value.

4. The infrared image sensor of claim 1, wherein the first IC comprises the ISP element, is configured to output the infrared image information outside the first IC, and is configured to output a value corresponding to a distance by which the lens module is to move, outside the first IC.

5. The infrared image sensor of claim 4, wherein the ISP element is configured to extract at least one of position information and acceleration information of the lens module, based on at least one of the infrared sensing information and the infrared image information, and
    wherein at least one of the AF control element and the OIS control element is configured to generate a value corresponding to a distance by which the lens module is to move, based on the at least one of the position information and the acceleration information.

6. The infrared image sensor of claim 1, wherein at least one of the AF control element and the OIS control element is configured to receive a detection result from at least one of a position sensor and an acceleration sensor, and output a value corresponding to a distance by which the lens module is to move, based on the detection result from the at least one of the position sensor and the acceleration sensor, outside the first IC.

7. The infrared image sensor of claim 1, wherein the first IC comprises the AF control element and the OIS control element.

8. An infrared camera module comprising:
    the infrared image sensor of claim 1;
    a lens module arranged to transmit infrared rays directed to the infrared image sensor;
    a sensor disposed to detect at least one of a position or acceleration of the lens module and configured to provide a detection result to the infrared image sensor; and
    a driver configured to drive the lens module to control at least one of the position or acceleration of the lens module, based on a value corresponding to a distance by which the lens module is to move, based on at least one of an autofocusing (AF) control element of the infrared image sensor and an optical image stabilization (OIS) control element of the infrared image sensor.

9. An infrared image sensor comprising:
a first IC and a second IC, stacked on each other;
a bolometer disposed on or above one surface of one of the first and second ICs configured to detect infrared rays passing through a lens module;
a via electrically connecting one of the first and second ICs to the bolometer; and
a reflective layer disposed between the bolometer and one of the first and second ICs,
wherein the first IC comprises at least one of a read-out (RO) element configured to perform analog processing for the bolometer to generate infrared sensing information and an image signal process (ISP) element configured to perform digital processing based on the bolometer to generate infrared image information, and
wherein the second IC comprises at least one of an autofocusing (AF) control element and an optical image stabilization (OIS) control element configured to adjust a positional relationship between the lens module and the bolometer.

10. The infrared image sensor of claim 9, wherein the second IC comprises at least a portion of the ISP element,
wherein the first IC is configured to transfer a remaining portion of the ISP element or a processing result of the RO element to the second IC, and
wherein the second IC is configured to output the infrared image information outside the second IC, and configured to output a value corresponding to a distance by which the lens module is to move, outside the second IC.

11. The infrared image sensor of claim 9, wherein the first IC comprises the RO element and the ISP element,
wherein the ISP element is configured to convert and digitally process the infrared sensing information into a digital value,
wherein the first IC is configured to output the infrared image information outside the first IC, and
wherein the second IC is configured to output a value corresponding to a distance by which the lens module is to move, outside the second IC.

12. The infrared image sensor of claim 9, further comprising a third IC stacked on one of the first and second ICs or stacked between the first and second ICs,
wherein the third IC comprises at least a portion of the ISP element, and is configured to output the infrared image information outside the third IC.

13. The infrared image sensor of claim 9, wherein the first IC comprises the ISP element,
wherein the ISP element is configured to extract at least one of position information and acceleration information of the lens module, based on at least one of the infrared sensing information and the infrared image information, and
wherein at least one of the AF control element and the OIS control element is configured to output a value corresponding to a distance by which the lens module is to move, based on the at least one of the position information and the acceleration information, outside the second IC.

14. The infrared image sensor of claim 9, wherein at least one of the AF control element and the OIS control element is configured to receive a detection result from at least one of a position sensor and an acceleration sensor, and is configured to output a value corresponding to a distance by which the lens module is to move, based on the detection result from the at least one of the position sensor and the acceleration sensor, outside the second IC.

15. The infrared image sensor of claim 9, wherein the second IC comprises the AF control element and the OIS control element.

16. The infrared image sensor of claim 9, wherein the first IC and the second IC are electrically connected to each other through a conductive pad or a through-silicon-via (TSV) disposed therebetween.

17. An infrared camera module comprising:
the infrared image sensor of claim 9;
a lens module arranged to transmit infrared rays directed to the infrared image sensor;
a sensor disposed to detect at least one of a position or acceleration of the lens module and configured to provide a detection result to the infrared image sensor; and
a driver configured to drive the lens module to control at least one of the position or acceleration of the lens module, based on a value corresponding to a distance by which the lens module is to move, based on at least one of an autofocusing (AF) control element of the infrared image sensor and an optical image stabilization (OIS) control element of the infrared image sensor.

* * * * *